(12) United States Patent
Rizzo et al.

(10) Patent No.: US 8,508,004 B2
(45) Date of Patent: Aug. 13, 2013

(54) MAGNETIC ELEMENT HAVING REDUCED CURRENT DENSITY

(75) Inventors: Nicholas D. Rizzo, Gilbert, AZ (US); Phillip G. Mather, Maricopa, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 115 days.

(21) Appl. No.: 12/952,661

(22) Filed: Nov. 23, 2010

(65) Prior Publication Data

US 2011/0062538 A1  Mar. 17, 2011

Related U.S. Application Data

(62) Division of application No. 11/870,856, filed on Oct. 11, 2007, now Pat. No. 7,932,571.

(51) Int. Cl.
*H01L 29/82* (2006.01)

(52) U.S. Cl.
USPC .......................................... 257/421; 257/422

(58) Field of Classification Search
USPC .................................. 257/421–427, E31.029
See application file for complete search history.

(56) References Cited

U.S. PATENT DOCUMENTS

| | | | |
|---|---|---|---|
| 6,920,063 | B2 | 7/2005 | Huai et al. |
| 6,992,359 | B2 | 1/2006 | Nguyen et al. |
| 7,897,201 | B2 * | 3/2011 | Yuasa et al. ............... 427/131 |
| 2004/0085681 | A1 | 5/2004 | Kai et al. |
| 2004/0257192 | A1 | 12/2004 | Mori et al. |
| 2007/0195594 | A1 | 8/2007 | Koga |
| 2007/0263429 | A1 | 11/2007 | Yamamoto et al. |

FOREIGN PATENT DOCUMENTS

| | | | |
|---|---|---|---|
| JP | 2005085821 | A | 3/2005 |
| JP | 2006100667 | A | 4/2006 |
| JP | 2008010590 | A | 1/2008 |
| WO | 2007075889 | A2 | 7/2007 |

OTHER PUBLICATIONS

Hayakawa, J., et al "Current-Induced Magnetization Switching in NgO Barrier based Magnetic Tunnel Junctions with CoFeB/Ru/CoFeB Synthetic Ferrimagnetic Free Layer," JJAP V. 45, No. 40, 2006, pp. L1057-L1060.

Nakamura, S., et al. "Current-Induced Magnetization Switching in Two Types of Nanopillar withDual Fixed Layers," JJAP, vol. 45, No. 5A, 2006, pp. 3846-3849.

Pan, G. "MRAM—present state of the art and future challenges," Jan. 16, 2006.

Freescale Semiconductor, Inc., "Magnetoresistive Random Access Memory," Jun. 23, 2006.

(Continued)

*Primary Examiner* — Cuong Q Nguyen
(74) *Attorney, Agent, or Firm* — Ingrassia Fisher & Lorenz, P.C.

(57) ABSTRACT

A memory device includes a fixed magnetic layer, a tunnel barrier layer over the fixed magnetic layer, and a free magnetic structure formed over the tunnel barrier layer, wherein the free magnetic structure has layers or sub-layers that are weakly magnetically coupled. Thus, a low programming voltage can be used to avoid tunnel barrier breakdown, and a small pass transistor can be used to save die real estate.

6 Claims, 5 Drawing Sheets

(56) References Cited

OTHER PUBLICATIONS

Fukumoto, Y., et al. "Low Writing Field with Large Writing Margin in Toggle Magnetic Random Access Memories Using Synthetic Antiferromagnet ferromagnetically coupled with with soft magnetic layers," Applied Physics Letters 89; 2006; pp. 061909-1 thru 061909-3; American Institute of Physics.

PCT Search Report for PCT Application PCT/US2008/079471 mailed on Jan. 20, 2009.
European Office Action issued Dec. 13, 2011 in EP Application No. 08837945.8.
Chinese Patent Office, Office Action Issued Jun. 12, 2012; Chinese Application No. 200880116627.6.
Japan Patent Office, Office Action in Japanese Patent Application No. 2010-529069, mailed Apr. 23, 2013.

\* cited by examiner

MAGNETIC ELEMENT HAVING REDUCED CURRENT DENSITY

CROSS-REFERENCE TO RELATED APPLICATION

This application claims priority to U.S. patent application Ser. No. 11/870,856, filed Oct. 11, 2007, which is incorporated herein by reference in its entirety.

BACKGROUND

1. Field

This disclosure relates generally to memory devices, and more specifically, to magnetic memory devices

2. Related Art

Non-volatile memory devices are an important component in electronic systems. FLASH is the major non-volatile memory device in use today. Typical non-volatile memory devices use charges trapped in a floating oxide layer to store information. Disadvantages of FLASH memory include high voltage requirements, slow program and erase times, low endurance, and limitations of scalability.

To overcome these shortcomings, the semiconductor industry is evaluating magnetic memory devices, such as magnetoresistive random access memory (MRAM). A memory state in MRAM is maintained by the direction of the magnetic moment, not by charges stored in a layer. MRAM includes a magnetic tunnel junction (MTJ) structure. The MTJ has a fixed magnetic layer separated from a free magnetic layer by a dielectric tunnel barrier. In conventional MRAM, data storage is accomplished by applying magnetic fields and causing the free layer to be magnetized either parallel or antiparallel to the fixed layer magnetization, corresponding to the two possible memory states. Recalling data is accomplished by sensing the resistance of a current tunneling between the free and fixed magnetic layers. If the magnetic moment of the free layer is parallel to the fixed layer moment, then the MRAM device has a low resistance. If, instead, the magnetic moment of the free layer is antiparallel to the fixed layer moment, the MRAM device has a high resistance. The magnetic fields for writing are created by passing currents through conductive lines external to the MTJ structure.

Different types of MRAM exist. One type is a toggle MRAM. In toggle MRAM, bits are programmed using magnetic fields that are generated by passing currents down conducting lines that are in close proximity to the bits. The same pulse sequence is used to switch from one state (e.g., a "1" or a "0") to another state (e.g., a "0" or a "1.") While toggle MRAM has some advantages, it does not achieve a small write current, especially for small cell sizes. Another type of MRAM, spin torque MRAM (STMRAM In ST-MRAM, the bits are programmed by allowing a spin-polarized electron current to impinge upon a magnetic free layer. The change of angular momentum associated with the spin-polarized current generates a torque on the free layer that can change its magnetization direction, for large enough currents. While ST-MRAM uses substantially less write current than a toggle MRAM, particularly at small cell sizes, the write current for STMRAM is still undesirably large and for some cells, requires a programming voltage that exceeds the breakdown voltage of the tunnel barrier (Vbd). In addition, a large write current requires a large pass transistor for selectively programming the bit in an array, thereby undesirably limiting the overall memory density. Therefore, a need exists to further decrease the programming currents for spin transfer effect devices.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
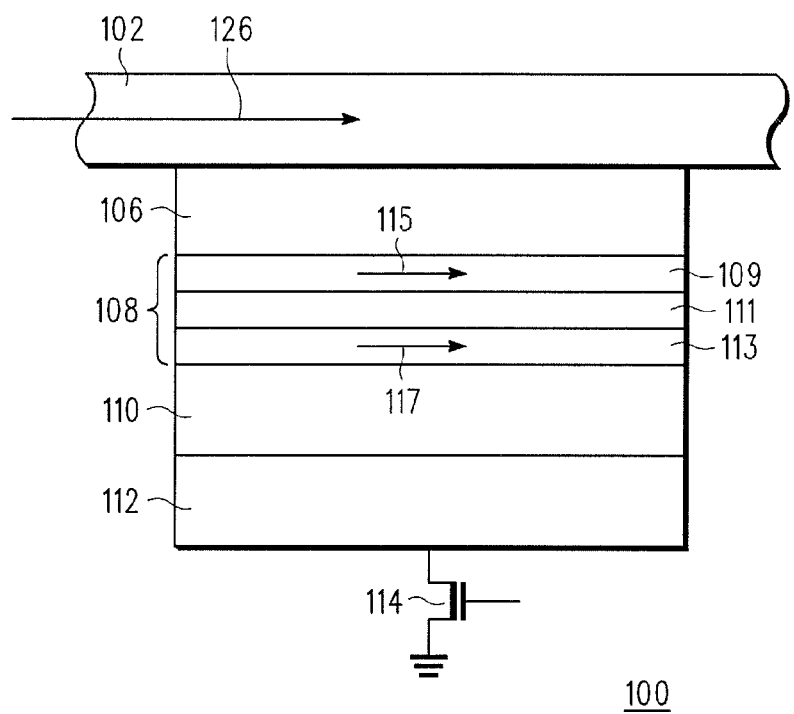
FIG. 1 illustrates a cross-sectional view of a memory device, such as an MRAM device, in accordance with one embodiment.

To decrease the programming currents in a STMRAM device, the free magnetic element of the MTJ structure includes weakly coupled magnetic layers. In one embodiment, the magnetic layers are weakly ferromagnetically coupled through thin nonmagnetic interlayers. In one embodiment, each of the thin interlayers is approximately 0.1 to approximately 2 nanometers in thickness. When a current is applied to a spin transfer effect memory device in accordance with an embodiment, a spin-torque is induced on the portion of the free layer closest to the tunnel barrier. As this layer reverses, the weak ferromagnetic coupling causes the other layers also to reverse sequentially. Thus, the switching event is spread out over multiple layers and delayed slightly in time, thereby reducing the peak torque (and hence peak current) required for reversal. In contrast, in conventional spin transfer effect MRAM devices the entire free layer reverses simultaneously due to the strong ferromagnetic coupling intrinsic to continuous magnetic materials. By using weakly magnetically coupled layers, a low programming current is achieved, preventing or minimizing tunnel barrier breakdown. In addition, the memory cell can include smaller pass transistors than conventional STMRAM structures, which desirably decreases the size of the cell. Therefore, higher density and lower power MRAM devices are possible. Furthermore, a free magnetic element with weakly coupled magnetic layers can be used in any suitable magnetic memory cell.

The spin-transfer effect used in spin-torque memory cells, such as MRAM, involves a current becoming spin-polarized after the electrons pass through the first magnetic layer in a magnet/non-magnet/magnet trilayer structure, where the first magnetic layer is non responsive "fixed", either because it is substantially thicker than the second magnetic layer, or because of magnetic coupling to an adjacent layer. The spin-polarized electrons cross the nonmagnetic spacer and then, through conservation of angular momentum, place a torque on the second magnetic layer, which switches the magnetization direction of the second layer to be parallel to the magnetization direction of the first layer. If a current of the opposite polarity is applied, the electrons instead pass first through the second magnetic layer. After crossing the nonmagnetic spacer, a torque is applied to the first magnetic layer. However, because it is fixed, the first magnetic layer does not switch. Thus, a fraction of the electrons will reflect off the first magnetic layer and travel back across the nonmagnetic spacer before interacting with the second magnetic layer. In this case, the spin-transfer torque switches the magnetization direction of the second layer to be anti-parallel to the magnetization direction of the first layer. Spin-transfer as described so far involves transmission of the current across all layers in the structure. Another possibility is spin-transfer reflection mode switching. In reflection mode, the current again becomes spin-polarized as the electrons pass through the first magnetic layer. The electrons then cross the nonmagnetic spacer layer, but instead of also crossing the second magnetic layer, the electrons follow a lower resistance path through an additional conductor leading away from the interface between the nonmagnetic spacer and the second magnetic layer. In the process, some fraction of the electrons will reflect off this interface and thereby exert a spin-transfer torque on the second magnetic layer to align it parallel to the first magnetic layer.

Referring to FIG. 1, a cross sectional view of an MRAM cell 100 is configured in accordance with one embodiment. In practice, an MRAM architecture or device will include many MRAM cells 100, which may be connected together in a matrix of columns and rows. MRAM cell 100 generally includes the following elements: a first conductor 102, which carries a write current 126; a spacer element 106; a free magnetic element or structure 108; an insulator 110; a fixed magnet element 112; and an isolation transistor or pass transistor 114.

In practice, first conductor 102 may be connected to any number of similar MRAM cells (e.g., a column of cells) to provide a common write current 126 to each of the connected cells. First conductor 102 is formed from any suitable material capable of conducting electricity. For example, first conductor 102 may include Al, Cu, Au, Ag, Ta, Ti, the like, or their combinations.

Spacer element 106 may be located between first conductor 102 and free magnetic element 108. Spacer element 106 is formed from an electrically conducting non-magnetic material, for example, Ta, TaN or other metallic materials. In one embodiment, spacer element 106 is not present.

The free magnetic element 108 is located between spacer element 106 (or first conductor 102 if spacer element 106 is not present) and insulator 110. In the embodiment illustrated in FIG. 1, the free magnetic element 108 includes a first free magnetic layer (or first sub-layer) 109 and a second free magnetic layer (or second sub-layer) 113 separated from each other by an interlayer 111. Both first free magnetic layer 109 and second free magnetic layer 113 are formed from magnetic materials having a variable magnetization. The same or different materials can be used for the sub-layers 109 and 113. For example, the magnetic materials used for first free magnetic layer 109 and second free magnetic layer 113 may include Ni, Fe, Mn, Co, the like, their alloys, alloys with B and O, or so-called half-metallic ferromagnets such as NiMnSb, PtMnSb, Fe.sub.3O.sub.4, or CrO.sub.2. In one embodiment, the first and second free magnetic layers 109 and 113 are each approximately 1 to approximately 5 nanometers thick. The direction of the variable magnetization of free magnetic element 108 determines whether MRAM cell 100 represents a "1" bit or a "0" bit. In practice, the direction of the magnetization of free magnetic element 108 is either parallel or anti-parallel to the direction of the magnetization of fixed magnet element 112.

The interlayer 111 can be any nonmagnetic material. In one embodiment, the interlayer 111 is a discontinuous nonmagnetic conductive material including Ta, Ti, Mg, Al, Cu, the like, or combinations of the above. In another embodiment, the interlayer 111 is a discontinuous nonmagnetic insulating material, such as an oxide, nitride, or oxynitride of Si, Al, Mg, Ti, Ta, Hf, Fe, Ni, Co, V, Zr, the like, or combinations of the above. If the interlayer 111 is an oxide or nitride, it can be formed by depositing an oxide or nitride layer or by exposing a layer (e.g., a layer of including Fe, Ni, Co, the like or combinations of the above) to an oxygen or nitrogen environment. If the interlayer 111 is a discontinuous nonmagnetic material, it preferably is approximately 0.1 to approximately 1 nanometer thick. In one embodiment, the thickness is chosen to achieve the desired amount of ferromagnetic coupling between free magnetic layers 109 and 113. When there is no interlayer between layers 109 and 113, the maximum ferromagnetic coupling is achieved, which can be equivalent to a coupling field of greater than 10.sup.4 Oe. When the interlayer thickness is in the range of approximately 0.1 to approximately 1 nm, it is usually discontinuous so that coupling still exists between free magnetic layers 109 and 113, but the magnitude may be significantly reduced. If the nonmagnetic interlayer is continuous, there is no ferromagnetic coupling between layers 109 and 113, although antiferromagnetic coupling is possible for some oxides. The desired level of ferromagnetic coupling is in the range of approximately 50 Oe to approximately 500 Oe, which may vary based on layer thickness, bit size, and shape. A skilled artisan will recognize that this measurement of ferromagnetic coupling might be a net ferromagnetic coupling, as some antiferromagnetic coupling can exist at the ends of the layers, as described herein.

In another embodiment, interlayer 111 is a conducting material that, depending on its thickness, can produce antiferromagnetic coupling or ferromagnetic coupling between layers 109 and 113. Such materials may include Ru, Os, Re, Rh, Cu, Cr, Ir, and the like. When the interlayer is so thin as to be discontinuous (in the range of approximately 0.1 to approximately 0.5 nm), there is ferromagnetic coupling between free magnetic layers 109 and 113. When the interlayer is continuous, there is antiferromagnetic coupling between layers 109 and 113, having a maximum magnitude of several hundred Oe for a thickness in the range of approximately 0.7 to approximately 1.1 nm. For thicker interlayers, the coupling can become weakly ferromagnetic again, typically in the thickness range of approximately 1.3 to approximately 1.5 nm.

In addition to the magnetic coupling from the interlayer 111, there is also antiferromagnetic (AF) coupling between free magnetic layers 109 and 113 caused by the magnetostatic fields produced primarily at the ends of the bits. This AF coupling may be taken into account when choosing the desired net coupling between free magnetic layers 109 and 113. The switching current may be reduced for either weak net ferromagnetic coupling or weak net antiferromagnetic coupling between free magnetic layers 109 and 113.

Free magnetic element 108 has a magnetic easy axis that defines a natural or "default" direction of its magnetization. When MRAM cell 100 is in a steady state condition with no write current 126 applied, the magnetization of free magnetic element 108 will naturally point along its easy axis. MRAM cell 100 is suitably configured to establish a particular easy axis direction for free magnetic element 108. From the perspective of FIG. 1, the magnetization of free magnetic element 108 points either to the right or to the left. The anisotropy, such as shape or crystalline anisotropy, of the free magnetic layer, 108 determines the direction of the respective easy axis in the free magnetic element 108. In the embodiment illustrated in FIG. 1, the free magnetic element 108 includes multiple magnetic layers and therefore, each magnetic layer has an easy axis. The easy axis for the first magnetic layer 109 and second magnetic layer 113 are in one embodiment in the same direction. As shown in FIG. 1, the magnetization of magnetic layers 109 and 113 are both pointing along their easy axis and to the right.

In this exemplary embodiment, insulator 110 is located between free magnetic element 108 and fixed magnet element 112. In one embodiment, fixed magnet element 112 includes a fixed magnetic layer, a spacer layer, a pinned magnetic layer, and an antiferromagnetic pinning layer. In this embodiment, insulator 110 is located between free magnetic element 108 and fixed magnetic layer 118. Insulator 110 is formed from any suitable material that can function as an electrical insulator. For example, insulator 110 may be formed from a material such as oxides or nitrides including Al, Mg, Si, Hf, Sr, Ti, Zr or the like. For purposes of MRAM cell 100, insulator 110 serves as a tunnel barrier element and the combination of free magnetic element 108, insulator 110, and fixed magnet element 112 form a MTJ.

In the illustrated embodiment, fixed magnet element 112 is located between insulator 110 and isolation transistor 114. Fixed magnet element 112 has a fixed magnetic layer 119 whose magnetization is either parallel or anti-parallel to the magnetization of free magnetic element 108. In one embodiment, the fixed magnet element is a single magnetic material, such as CoFe.

In another embodiment, the fixed magnet element 112 includes a fixed magnetic layer, a spacer layer, a pinned magnetic layer, and an antiferromagnetic pinning layer. In this embodiment, fixed magnetic layer and pinned magnetic layer have anti-parallel magnetizations. Fixed magnetic layer and pinned magnetic layer may be formed from any suitable magnetic material, such as at least one of the elements Ni, Fe, Mn, Co, their alloys or alloys with B or O, as well as so-called half-metallic ferromagnets such as NiMnSb, PtMnSb, $Fe_3O_4$, or $CrO_2$. Antiferromagnetic layer may include, for example, IrMn, NiMn, and FeMn, RhMn, or PtMn. Spacer layer may be formed from any suitable non-magnetic material, including Ru, Os, Re, Cr, Rh, Cu, or their combinations.

The isolation transistor 114 includes a first current electrode coupled to a voltage potential, a second current electrode coupled to the fixed magnetic layer 122 and a gate that, when selected, allows electrons to flow through the cell 100 to the first conductor 102. The isolation transistor 114 is addressed when it is desired to write the cell 100 by providing a current from the first conductor 102 to the isolation transistor 114.

In practice, MRAM cell 100 may employ alternative or additional elements, and one or more of the elements depicted in FIG. 1 may be realized as a composite structure or combination of sub-elements. The specific arrangement of layers shown in FIG. 1 merely represents one embodiment.

Figure 2:
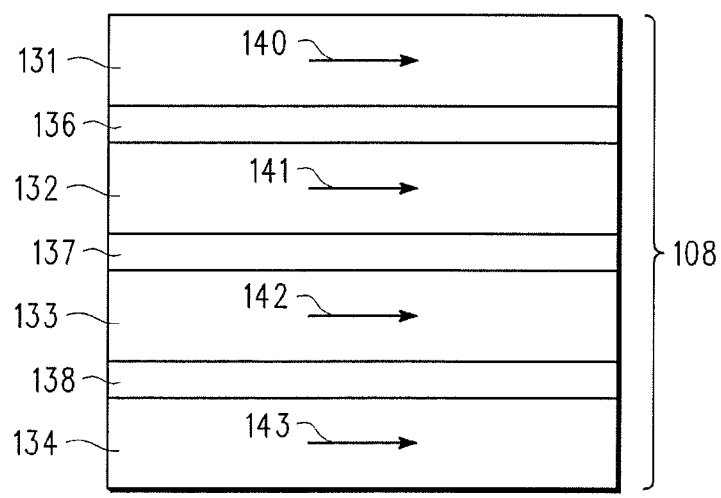
FIG. 2 illustrates a cross-sectional view of a free magnetic element in accordance with one embodiment.

FIG. 2 illustrates the free magnetic element 108 in accordance with another embodiment. In this embodiment, the free magnetic element 108 includes multiple free magnetic layers 131-134 (i.e., a first free magnetic layer 131, a second free magnetic layer 132, and a third free magnetic layer 133, and a fourth free magnetic layer 134). Between pairs of the free magnetic layers 131-134 are interlayers 136-138 (i.e., first interlayer 136, second interlayer 137, and third interlayer 138). The free magnetic layers 131-134 can be any of the materials and have any of the dimensions discussed for the free magnetic layers 109 and 113. In addition, the interlayers 136-138 can be any of the materials and have any of the dimensions discussed for the interlayer 111. As discussed in regards to free magnetic layers 109 and 112, the free magnetic layers 131-134 preferably have the same easy axis direction as each other. As shown in FIG. 2, each of the free magnetic layers 131-134 has a magnetization direction as illustrated by the arrows 140-143. Also shown in the embodiment illustrated in FIG. 2, there is a net ferromagnetic coupling between the free magnetic layers 131-134, since their magnetization directions are parallel with no current applied. In an embodiment where there is net antiferromagnetic coupling between the free magnetic layers 131-134, the magnetization direction of each layer would be antiparallel with either of its nearest neighbors. In one embodiment, the free magnetic element 108 can be viewed as one free magnetic material with embedded interlayers. Although embodiments having two or four free magnetic layers with one to three interlayers, respectively, between the free magnetic layers are illustrated in FIGS. 1 and 2, a skilled artisan appreciates that these are only examples and any number of free magnetic layers and interlayers may be present (e.g., three magnetic layers and two interlayers, five magnetic layers and four interlayers, six magnetic layers and five interlayers, etc.). The more magnetic layers and interlayers in the free layer, the lower the switching current needed. Thus, it is advantageous to have more than one or two magnetic layers and more than one interlayer.

Thus, in one embodiment a memory device includes a fixed magnetic layer; a tunnel barrier layer over the fixed magnetic layer, and a free magnetic layer formed over the tunnel barrier layer, wherein the free magnetic layer includes a first free magnetic layer; a second free magnetic layer, wherein the second free magnetic layer is weakly ferromagnetically or antiferromagnetically coupled to the first free magnetic layer; and a third free magnetic layer, wherein the third free magnetic layer is weakly ferromagnetically or antiferromagnetically magnetically coupled to the second free magnetic layer. In one embodiment, the memory device further includes a first non-magnetic layer between the first free magnetic layer and the second free magnetic layer, and a second non-magnetic layer between the second free magnetic layer and the third free magnetic layer, wherein the first non-magnetic layer is a discontinuous insulator. In one embodiment, the second non-magnetic layer is also a discontinuous insulator; it can be the same or a different insulator than the first non-magnetic layer.

Figure 3:
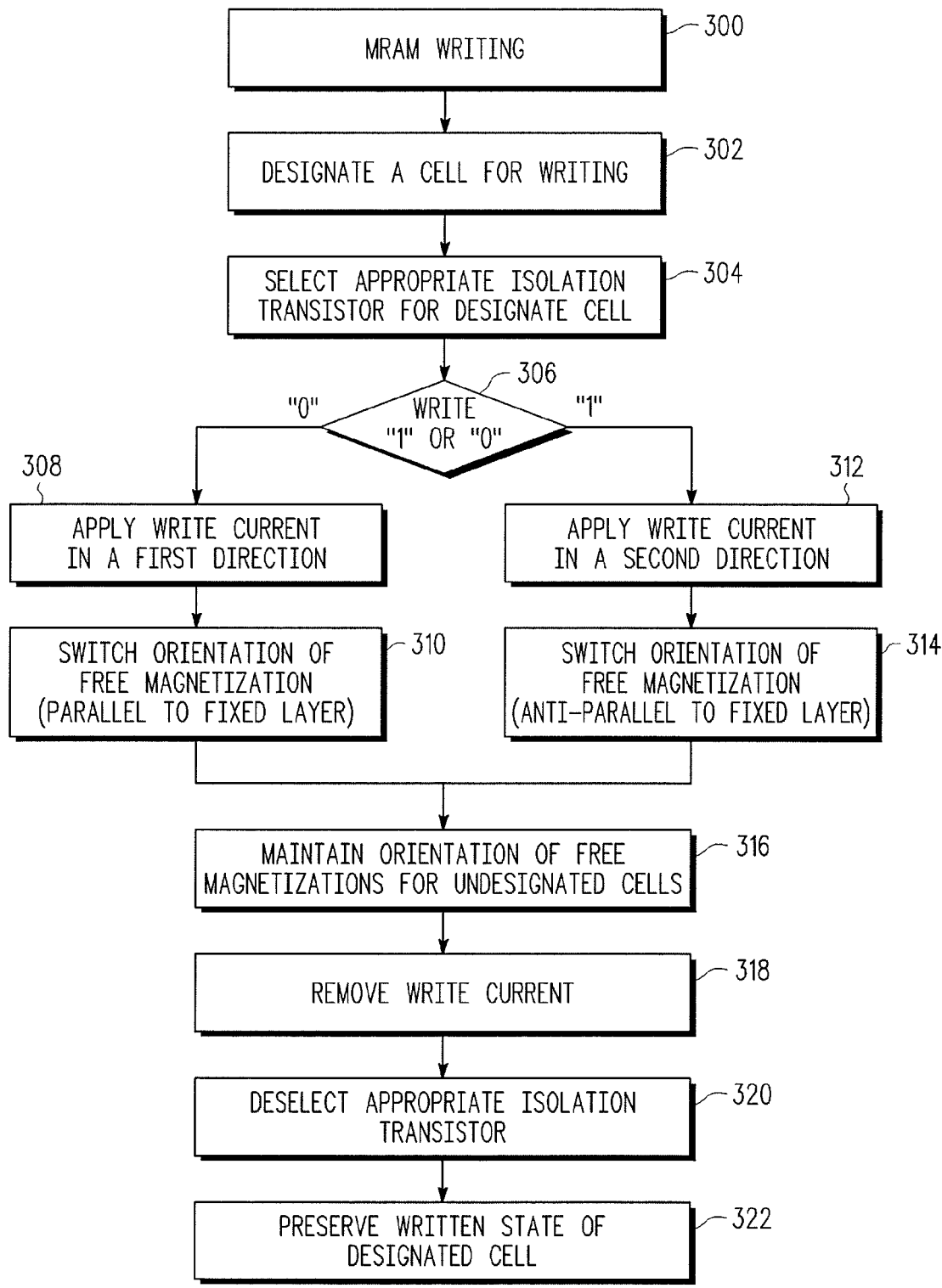
FIG. 3 a flow chart illustrating a method writing a memory cell in accordance with one embodiment.

FIG. 3 is a flow chart of an MRAM writing process 300 in accordance with one embodiment that may be performed when writing data to an MRAM array that includes MRAM cells 100. Process 300 may be performed or controlled by one or more logic or processor elements (see, for example, FIG. 5) such as those found in computer systems. In a practical implementation, process 300 may include any number of additional or alternative tasks, and process 300 may be incorporated into a more complex memory control read/write procedure. Furthermore, the tasks depicted in process 300 need not be performed in the order shown in FIG. 3 and one or more of the tasks may be performed concurrently.

MRAM writing process 300 begins with a task 302, which designates an MRAM cell in the MRAM array for writing. In a typical "two dimensional" MRAM array, task 302 may identify a row and a column to designate the MRAM cell. Once the MRAM cell is designated, a write current is applied to a conductor line that is coupled to a row of MRAM cells (task 304) by selecting isolation transistor 114; the current will pass through the bit in the designated MRAM cell.

If a "1" bit is to be written (query task 306), then MRAM writing process 300 applies a write current in a first direction to the designated MRAM cell (task 308); In response to the write current, the direction of the magnetization for the free magnetic element in the designated MRAM cell is switched to a written state (task 310). The direction of the magnetization for the free magnetic element in the designated MRAM cell is switched to become anti-parallel to the direction of the magnetization for the fixed magnetic element in the designated MRAM cell.

If a "0" bit is to be written (query task 306), then MRAM writing process 300 applies a write current in a second direction to the designated MRAM cell (task 312). The direction of the magnetization for the free magnetic element in the designated MRAM cell is switched to become parallel to the direction of the magnetization for the fixed magnetic element in the designated MRAM cell.

Figure 4:
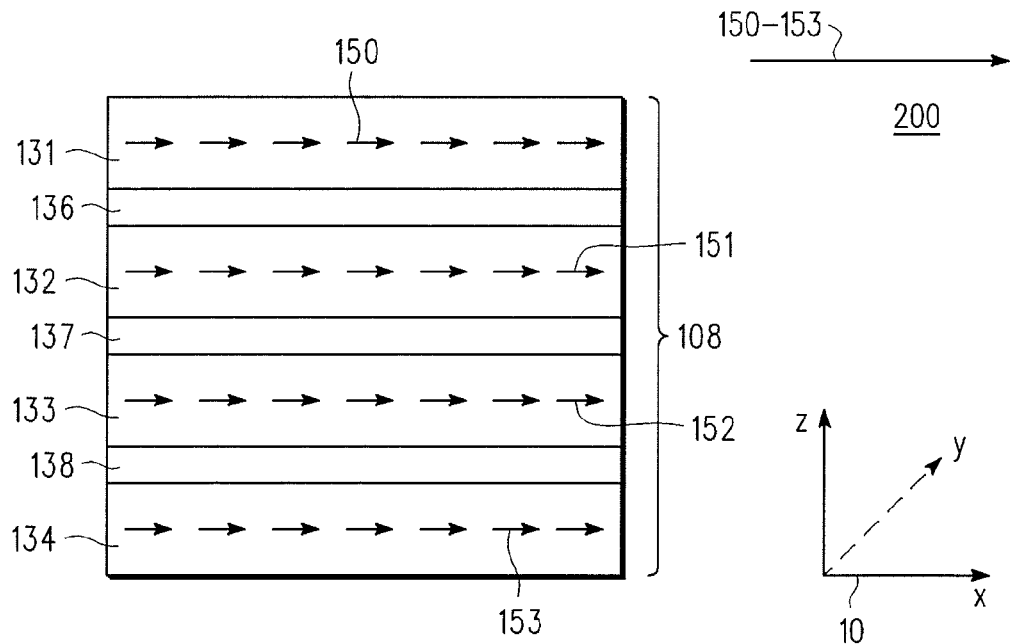
FIGS. 4-7 illustrates views of the free magnetic element in FIG. 2 during a write process in accordance with one embodiment.
Figure 5:
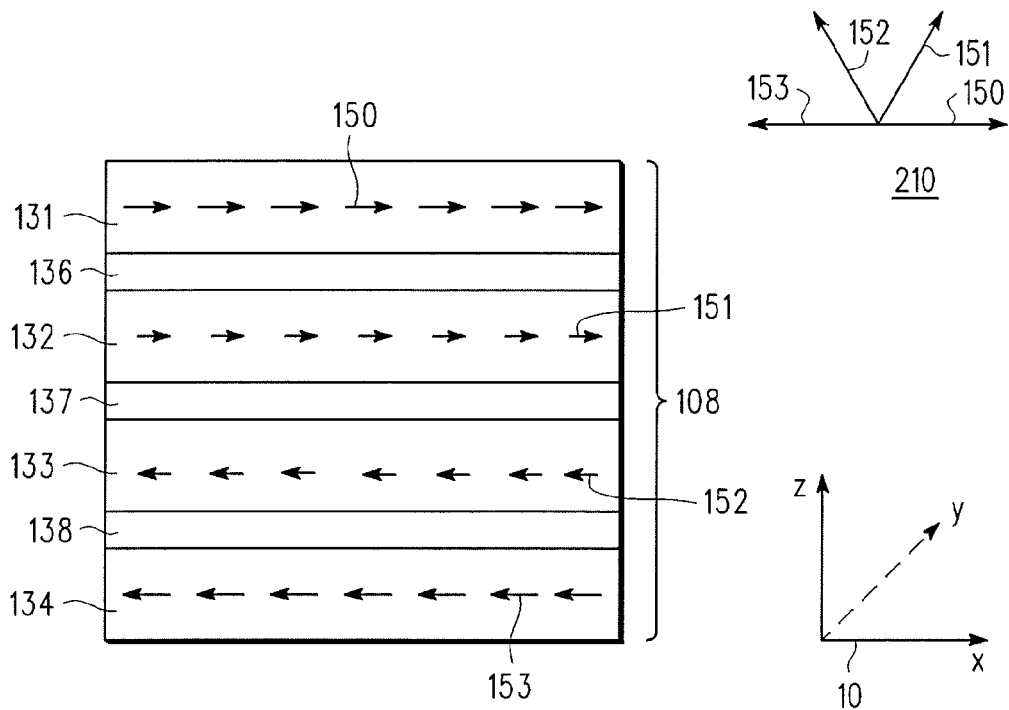

FIGS. 4-7 illustrate how the spin-torque reversal travels through the free magnetic element 108 of FIG. 2 in accordance with one embodiment. All of the cross-sections in FIGS. 4-7 are cross-sections taken in the x-z plane, as illustrated by axis 10 in each figure. FIG. 4 shows the free magnetic element 108 before a write current is applied; the spins 150-153 of each sub-layer 131-134 are all in the same direction. (Spins 150-153 represent the magnetization direction of each sub-layer 131-134) Element 200 illustrates the direction of the spins 150-153 of each sub-layer 131-134 in the x-y plane. Since the spins 150-153 of the sub-layers 131-134 are in the same direction, the arrow in element 200 illustrates the spins 150-153 of all the sub-layers 131-134. When current is transmitted through the free magnetic element 108 the layer nearest the tunnel junction, which is the fourth free magnetic layer 134 in the embodiment illustrated, reverses first, as shown in FIG. 5. At the same time, the third free magnetic layer 133 begins to reverse followed by the second free magnetic layer 132. The first free magnetic layer 131 may not have reversed yet. The reversal occurs in the x-y plane around the z-axis, as the axes are defined in the illustrations. In the embodiment illustrated, spins 152 are rotated approximately 60 degrees relative to spins 153, as illustrated by element 210. Hence, spins 152 are illustrated as nearly pointing out of the plane of the paper by having a shorter arrow length. In the embodiment illustrated, the spins 151 are rotated approximately 60 degrees relative to the spins 150 and approximately 60 degrees relative to the spins 152, as illustrated by element 210. Hence, the arrows denoting spins 151 in magnetic layer 132 of element 108 are also drawn as being shorter than arrows 150 because they are at an angle to the paper.

Figure 6:
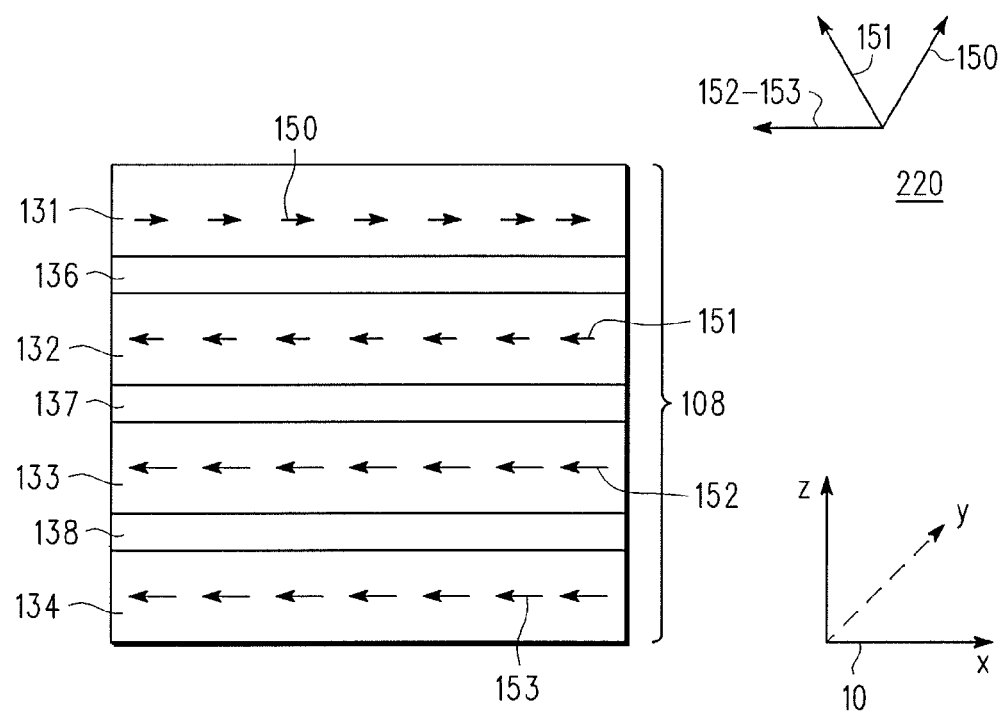
Figure 7:
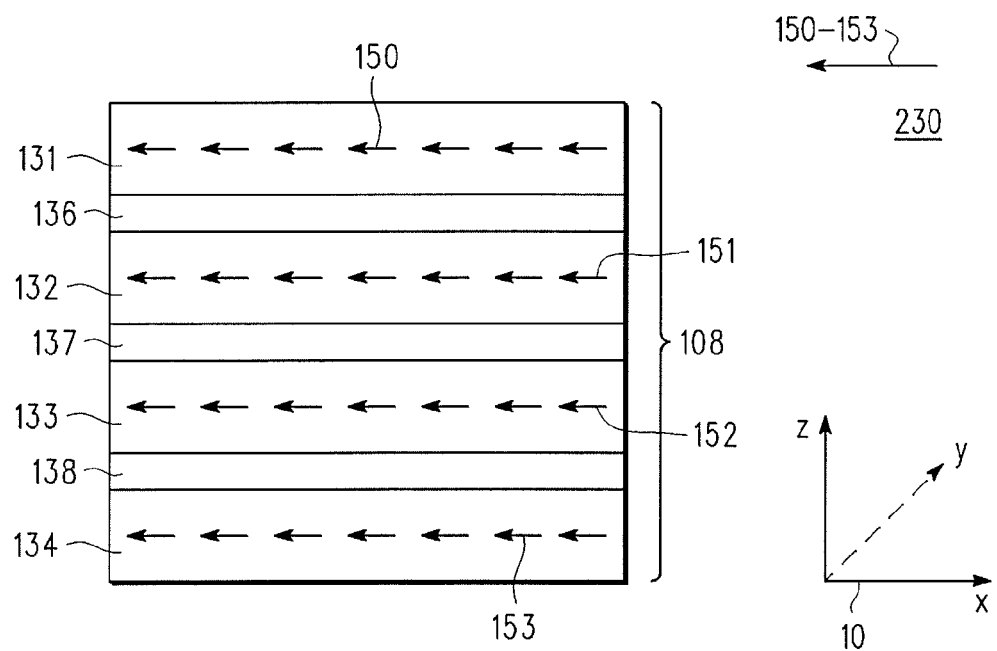

After more time, which in one embodiment may be approximately 0.25 nanoseconds, the third free magnetic layer 133, like the fourth free magnetic layer 134, has completely reversed, the second free magnetic layer 132 has reversed more, and the first free magnetic layer 131 has begun to reverse, as shown in FIG. 6. As illustrated in element 220, the second free magnetic layer 132 has spins 151 that are approximately 60 degrees with respect to the spins 152 of the third free magnetic layer 133, and approximately 60 degrees with respect to the spins 150 of the first free magnetic layer 131. This direction of the spins 151 is illustrated in magnetic layer 132 of element 108 by the arrows denoting spins 151 being of shorter length than arrows denoting spins 152, but with the spins 151 pointing in the same direction as spins 152. Since the spins 150 of the first free magnetic layer 131 are nearly pointing out of the page, the spins 150 are also illustrated by arrows having a shorter length. After additional time, all of the sub-layers have reversed as shown in FIG. 7. If the free magnetic element is approximately 4 nanometers thick and has 4 magnetic layers the entire write process may be approximately 1 nanosecond. Elements 230 shows the spins 150-153 being opposite (i.e., 180 degrees from) the spins 150-153 in element 200, which shows the spins 150-153 prior to application of a switching current.

A skilled artisan should recognize that the reversal of the spins illustrated in FIGS. 4-7 had the spins rotating or reversing in a clockwise direction in the x-y plane around the z-axis. However, the spins could rotate in a counterclockwise direction. If the spins rotated in a counterclockwise direction, some of the spins would point into the page, which could be illustrated by an x with a circle around it as opposed to dots with circles around each of them.

Thus, as shown in FIGS. 4-7, there is a sequential changing of the direction of the magnetization through the free magnetic element 108 from the bottom of the free magnetic element 108 (i.e., the fourth free magnetic layer 134) to the top of the free magnetic element 108 (i.e., the first free magnetic layer 131). The sequential spin-torque induced reversal in the z-direction (from bottom to top or vice versa) of the free magnetic element 108 occurs because each of the free magnetic layers are weakly magnetically coupled. In other words, the weak exchange coupling induces domain-wall like spin torque reversal. Weakly coupled is any magnetic coupling that is substantially less than the exchange coupling of a ferromagnetic material, which is approximately $10.\text{sup}.6$ Oersted (Oe) or more. In one embodiment, the weakly coupled layers are approximately −500 to approximately 1,000 Oe. By using a sequential spin-torque induced reversal instead of the conventional coherent rotation, where all spins reverse simultaneously, the switching event is spread out over multiple layers and delayed in time. Because the switching torque is applied only to one layer at a time, where each layer is thinner than the overall thickness of the free magnetic element 108, a lower switching current is applied. For example, a micromagnetic simulation showed that for a bit of size 0.08 um.times.0.16 um, having 4 weakly ferromagnetically coupled layers of NiFe, each 1 nm thick, the spin torque switching current was reduced by more than a factor of 2 compared to the case of a continuous 4 nm thick NiFe layer with strong coupling throughout. Furthermore, the overall thickness of the free magnetic element 108 is still sufficiently large enough (e.g., 4 nanometers) so that stability against thermal effects is maintained. This stability allows data to be retained.

The embodiment illustrated in FIGS. 4-7 shows ferromagnetic coupling. However, the coupling can be ferromagnetic or antiferromagnetic.

Once the spin-torque rotation of the free magnetic element 108 is completed, the switch of the free magnetization (task 310 or 314) is complete. The selective writing technique of MRAM writing process 300 maintains the magnetization direction of the free magnetic elements for all of the undesignated MRAM cells (task 316). After the data is written to the designated MRAM cell, the write current is removed (task 318). After removing the write current, the isolation transistor that was selected in task 304 is deselected (task 320). The deselection of the isolation transistor and the removal of the write current are desirable to preserve the written state of the designated cell (task 322).

Figure 8:
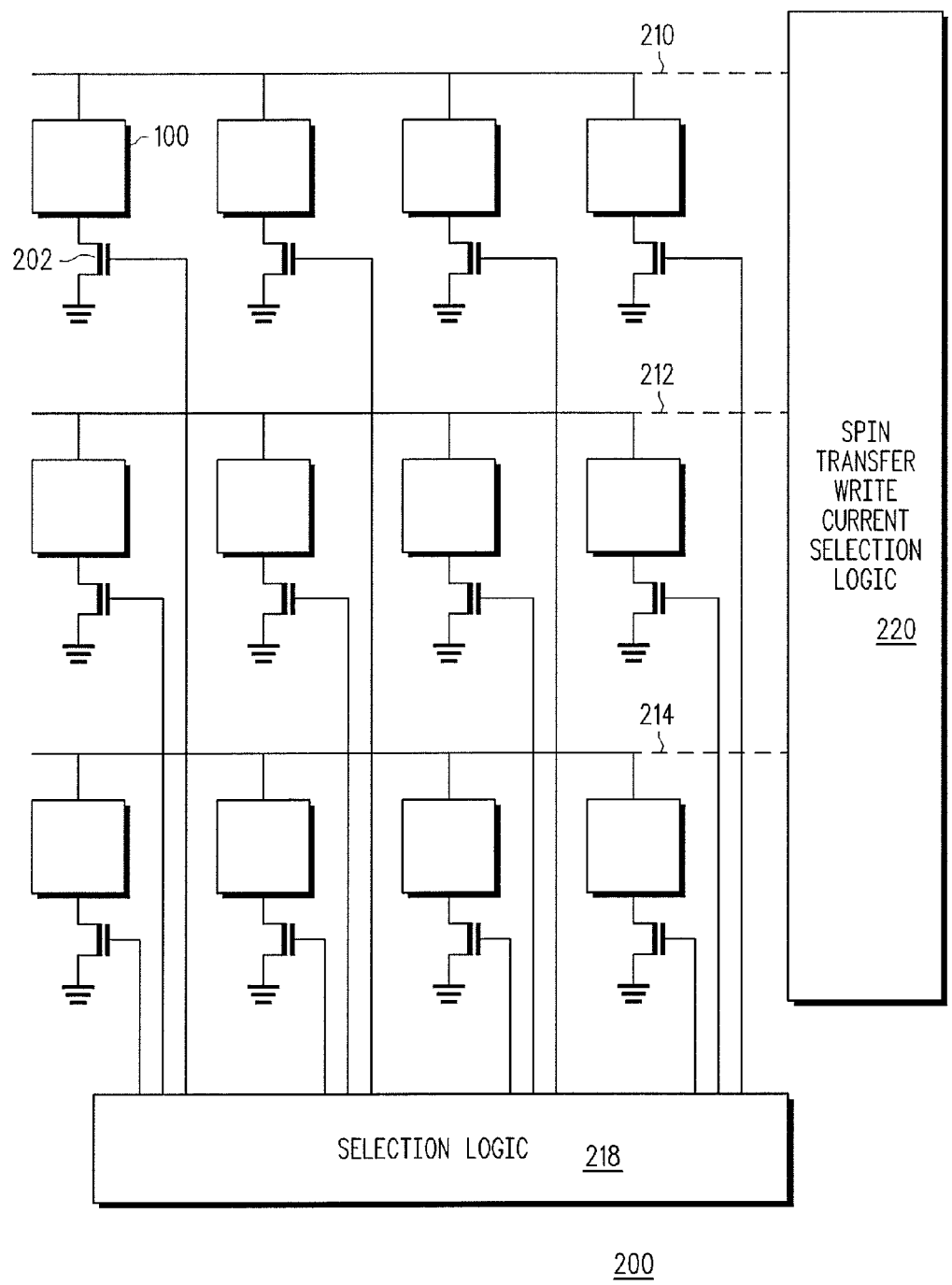
FIG. 8 illustrates a schematic representation of an array of memory cells in accordance with an embodiment.

A practical MRAM architecture may include an array or matrix of MRAM cells 100 having individual write selectivity. FIG. 8 is a schematic representation of an example MRAM array 200 that may employ any number of MRAM cells 100. The dashed lines in FIG. 8 indicate that the MRAM array 200 can include any number of rows and any number of columns. In this example, each cell 100 is coupled to its own isolation transistor 202, and cells 100 in a given row share a common write line 210, 212, and 214. MRAM array 200 includes selection logic 218 that controls the selection of isolation transistor 202, and spin transfer write current selection logic 220 that controls the selection or application of current to the appropriate write line 210, 212, 214. An MRAM writing process similar to process shown in FIG. 3 can be utilized to write data to the MRAM array 200.

By now it should be appreciated that there has been provided a memory device and a method of switching a memory device that reduces the switching current compared to a memory device with a free magnetic layer that reverses simultaneously. In one embodiment, this is achieved by using a free magnetic element that includes sub-layers that are weakly magnetically coupled so that the spin-torque induced reversal proceeds sequentially through the free magnetic element. This allows a lower programming voltage to be used, avoiding tunnel barrier breakdown, and a small pass transistor to be used, thus saving die real estate.

As should be appreciated, in one embodiment, a memory device includes a fixed magnetic layer; a tunnel barrier layer over the fixed magnetic layer; and a free magnetic structure formed over the tunnel barrier layer, wherein the free magnetic structure has a first layer and a second layer, the first layer is weakly magnetically coupled to the second layer with a coupling strength, and the coupling strength is chosen to produce a minimum spin-torque switching current. In one embodiment, first layer is weakly ferromagnetically coupled to the second layer. In one embodiment, first layer is weakly antiferromagnetically coupled to the second layer.

In one embodiment, a method of switching a memory device includes forming a fixed magnetic layer, forming a tunnel barrier layer over the fixed magnetic layer, forming a free magnetic layer formed over the tunnel barrier layer, wherein the free magnetic layer or structure includes forming a first sub-layer or layer formed over the tunnel barrier layer, wherein the first sub-layer is a first free magnetic material, forming a first interlayer formed in contact with the first sub-layer; and forming a second sub-layer or layer formed in contact with the first interlayer, wherein the second sub layer is a second free magnetic material, and the method further comprises applying a write current to the memory device, wherein when applying the write current the magnetic spins sequentially switch. One embodiment, wherein the magnetic spins sequentially switch comprises having the magnetic spin of the first sub-layer switch before the magnetic spin of the second sub-layer switches.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Furthermore, those skilled in the art will recognize that boundaries between the functionality of the above-described operations are merely illustrative. The functionality of multiple operations may be combined into a single operation, or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Unless stated otherwise, terms such as "first" and "second" are used to arbitrarily distinguish between the elements such terms describe. Thus, these terms are not necessarily intended to indicate temporal or other prioritization of such elements.

Various embodiments are discussed below.

1. A memory device comprising: a fixed magnetic layer; a tunnel barrier layer over the fixed magnetic layer; and a free magnetic structure formed over the tunnel barrier layer, wherein the free magnetic structure comprises: a first free magnetic layer; a first interlayer in contact with the first free magnetic layer; and a second free magnetic layer, wherein the second free magnetic layer is weakly ferromagnetically coupled to the first free magnetic layer and is in contact with the first interlayer; and wherein the memory device is capable of being programmed by impinging a spin-polarized electron current on the free magnetic structure.

2. The memory device of item 1, wherein the ferromagnetic coupling strength is between 50 Oersteds to 500 Oersteds 3. The memory device of item 1, wherein the first interlayer comprises an element selected from the group consisting of Ru, Rh, Os, and Re and wherein the first interlayer has a thickness in the range of approximately 1.2 to approximately 1.7 nanometers.

4. The memory device of item 1, wherein the first interlayer comprises an insulating material.

5. The memory device of item 4, wherein the first interlayer comprises an oxide comprising an element selected from the group consisting of Si, Mg, Al, Ti, Ta, Hf, Fe, Ni, Co, V, and Zr.

6. The memory device of item 1, wherein the first interlayer comprises a conductive material.

7. The memory device of item 6, wherein the first interlayer comprises a metal comprising an element selected from the group consisting of Ta, Ti, Mg, Hf, Al, Ru, Os, Re, Rh, V, Cu and B.

8. The memory device of item 1, wherein the first interlayer has a thickness in the range of approximately 0.1 to approximately 1 nm.

9. A memory device comprising: a fixed magnetic layer; a tunnel barrier layer over the fixed magnetic layer; and a free magnetic structure formed over the tunnel barrier layer, wherein the free magnetic structure comprises a free magnetic material embedded within a non-magnetic insulating material.

10. The memory device of item 9, wherein the free magnetic structure comprises sub-layers that are weakly ferromagnetically coupled.

11. The memory device of item 10, wherein the sub-layers are the same material.

12. The memory device of item 10, wherein the sub-layers are different materials.

13. The memory device of item 9, wherein the non-magnetic insulating material is discontinuous.

14. A memory device comprising: a fixed magnetic layer; a tunnel barrier layer over the fixed magnetic layer; and a free magnetic structure formed over the tunnel barrier layer, wherein the free magnetic structure comprises: a first free magnetic layer; a second free magnetic layer, wherein the second free magnetic layer is weakly magnetically coupled to the first free magnetic layer; and a third free magnetic layer, wherein the third free magnetic layer is weakly magnetically coupled to the second free magnetic layer and wherein: the memory device is capable of being programmed by impinging a spin-polarized electron current on the free magnetic structure.

15. The memory device of item 14, wherein the second free magnetic layer is weakly ferromagnetically coupled to the first free magnetic layer.

16. The memory device of item 14, wherein the second free magnetic layer is weakly antiferromagnetically coupled to the first free magnetic layer.

17. The memory device of item 16, further comprising a first interlayer between the first free magnetic layer and the second free magnetic layer.

18. The memory device of item 17, wherein the first interlayer comprises a metal comprising an element selected from the group consisting of Rh, Ru, Re, Os, and Cu.

19. The memory device of item 17, wherein the first interlayer comprises a continuous metal layer.

20. The memory device of item 17, wherein the first interlayer comprises an oxide comprising an element selected from the group consisting of Si, Mg, Al, Ti, Ta, Fe, Ni, Co, V, and Zr.

What is claimed is:

1. A memory device comprising:
   a fixed magnetic layer;
   a tunnel barrier layer over the fixed magnetic layer; and
   a free magnetic structure formed over the tunnel barrier layer, wherein the free magnetic structure comprises:
      a first free magnetic layer;
      a second free magnetic layer;
      a first interlayer positioned between the first and second free magnetic layers and having a thickness of less than 1.5 nanometers, wherein the second free magnetic layer is weakly magnetically coupled at less than 1000 Oe to the first free magnetic layer;
      a third free magnetic layer; and
      a second interlayer positioned between the second and third free magnetic layers and having a thickness of less than 1.5 nanometers, wherein the third free magnetic layer is weakly magnetically coupled at less than 1000 Oe to the second free magnetic layer and wherein:
      the memory device is capable of being programmed by impinging a spin-polarized electron current on the free magnetic structure.

2. The memory device of claim 1, wherein the second free magnetic layer is weakly ferromagnetically coupled to the first free magnetic layer.

3. The memory device of claim 1, wherein the second free magnetic layer is weakly antiferromagnetically coupled to the first free magnetic layer.

4. The memory device of claim 1, wherein the first interlayer comprises a metal comprising an element selected from the group consisting of Rh, Ru, Re, Os, and Cu.

5. The memory device of claim 1, wherein the first interlayer comprises a continuous metal layer.

6. The memory device of claim 1, wherein the first interlayer comprises an oxide comprising an element selected from the group consisting of Si, Mg, Al, Ti, Ta, Fe, Ni, Co, V, and Zr.

* * * * *